United States Patent
Chen et al.

[11] Patent Number: 6,071,375
[45] Date of Patent: Jun. 6, 2000

[54] GAS PURGE PROTECTION OF SENSORS AND WINDOWS IN A GAS PHASE PROCESSING REACTOR

[75] Inventors: Anthony L. Chen, Oakland; John Holland, Santa Clara, both of Calif.

[73] Assignee: Lam Research Corporation, Fremont, Calif.

[21] Appl. No.: 09/001,483

[22] Filed: Dec. 31, 1997

[51] Int. Cl.[7] .................................................. C23F 1/02
[52] U.S. Cl. .................... 156/345; 118/715; 118/719; 162/43; 162/237; 162/249; 204/298.31; 204/298.33; 134/1
[58] Field of Search ................................ 134/1; 156/345, 156/345 MT, 345 MC; 162/43, 237, 249; 204/298.31, 298.33; 118/715, 719

[56] References Cited

U.S. PATENT DOCUMENTS

| | | |
|---|---|---|
| 4,602,981 | 7/1986 | Chen et al. . |
| 4,615,761 | 10/1986 | Tada et al. . |
| 4,675,072 | 6/1987 | Bennett et al. . |
| 4,846,920 | 7/1989 | Keller et al. . |
| 4,960,488 | 10/1990 | Law et al. ................................ 156/643 |
| 5,045,149 | 9/1991 | Nulty . |
| 5,160,576 | 11/1992 | Robbins . |
| 5,433,780 | 7/1995 | Ikaeda et al. ............................. 118/50 |
| 5,450,205 | 9/1995 | Sawin et al. . |
| 5,679,214 | 10/1997 | Kuo ...................................... 156/643.1 |

*Primary Examiner*—William Krynski
*Assistant Examiner*—Michael Grendzynski
*Attorney, Agent, or Firm*—Burns, Doane, Swecker & Mathis, LLP

[57] ABSTRACT

A gas purged viewport for endpoint detection in a gas phase processing chamber is provided which prevents contamination of an optical monitoring window by use of a purge gas flow. The purge gas purges the viewport and prevents deposition of byproducts and contaminants on the window which will adversely effect endpoint detection. The gas purge viewport includes a prechamber between the optically transparent window and the process chamber. The purge gas is passed through the prechamber and into the processing chamber to purge the window. The gas purge system may also be used to purge other parts such as sensors.

15 Claims, 1 Drawing Sheet

FIG. 1
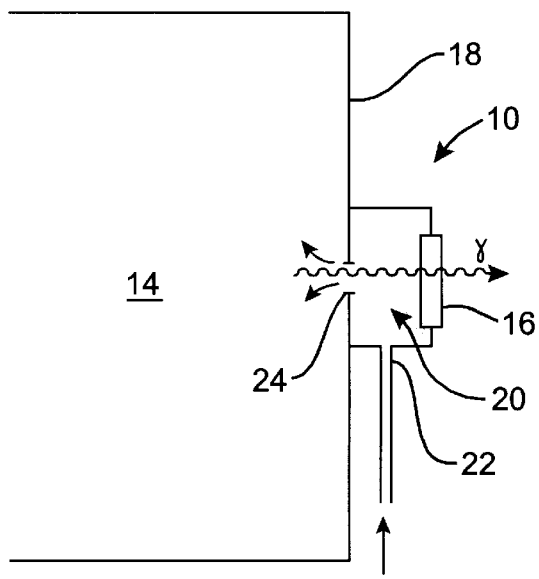
FIG. 2
FIG. 3
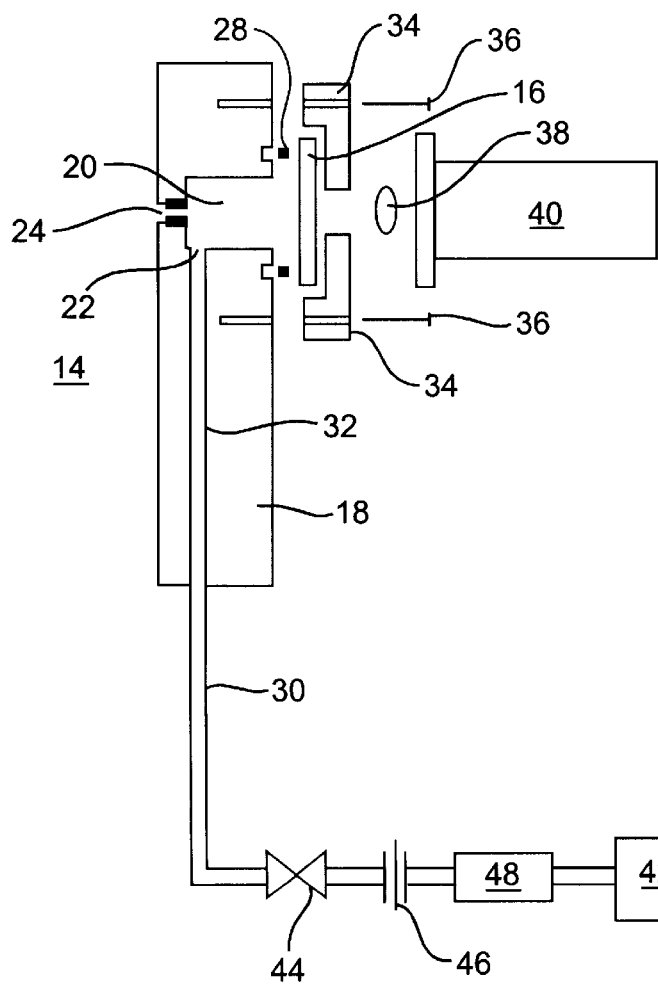

GAS PURGE PROTECTION OF SENSORS AND WINDOWS IN A GAS PHASE PROCESSING REACTOR

FIELD OF THE INVENTION

The present invention relates to a gas phase processing reactor, and more particularly, the invention relates to devices and methods for purging a part within a reactor to protect the part from process gas which may corrode or attack the part.

BACKGROUND OF THE INVENTION

The techniques used in the fabrication of integrated circuits and flat panel displays include film deposition processes and etching or stripping processes. These processes are generally performed in a processing reactor containing a plasma which is formed by the application of RF or microwave power to a process gas in the reactor chamber. When films are formed or etched, it is important that the deposition or etching processes be controlled to deposit a film of the correct thickness or etch a film to the corrected depth.

Deposition of silicon dioxide ($SiO_2$) is an important process for insulating between metal layers on integrated circuits or for processing devices such as flat panel displays. Determining the deposition rate of the $SiO_2$ is important to ensure that the $SiO_2$ film deposited on the substrate is of the desired thickness. One technique for obtaining a particular film thickness includes repeatedly depositing films on successive substrate samples until an appropriate film thickness is achieved and determining the period of time required to achieve the desired film thickness. However, this technique for obtaining a proper film thickness is time-consuming and relatively inaccurate. Accordingly, optical endpoint monitoring systems have been developed to monitor deposition processes through a window in the process chamber.

It is also important to monitor etching process endpoints in plasma chambers to determine when etching has been performed to a proper etch depth. Typically, endpoints of an etching process in plasma chambers are monitored by analyzing light emissions of plasmas in the plasma chamber or laser illumination reflected from the substrate through a window in the chamber. For example, U.S. Pat. No. 4,615,761 involves monitoring the quantity of radiation corresponding to a selected one of the plasma reaction products to ascertain when an etching reaction is finished. Also, U.S. Pat. No. 5,045,149 discloses a method and apparatus for detecting the endpoint of a process of etching a first material which has been formed over a second material. According to this method the optical emission intensity of the plasma etch process is simultaneously monitored by a positive filter and a negative filter generating first and second signals, respectively. The first and second signals are combined to yield a combined signal which is monitored for a change indicative of the first material having been etched away exposing the second material.

In addition to monitoring endpoints of plasma etching processes, endpoints of plasma deposition processes are also monitored by measuring optical emission intensities. For example, U.S. Pat. No. 5,450,205 discloses monitoring of an etching or deposition process by a charge coupled device (CCD) camera during plasma processing. Plasma emission from the plasma processing chamber or laser illumination reflected from the substrate exhibit different optical characteristics which are measured to monitor etching or deposition process endpoints.

It is also desirable to accomplish the objective of monitoring endpoints in an in-situ clean process. Plasma reactors accumulate reaction byproducts on their interior chamber surfaces as films are deposited or etched in the chamber. These byproducts must be periodically cleaned off the inside walls of the reactor before the accumulated particles on the sidewalls interfere with and contaminate the deposition or etching process. One method of cleaning a plasma reactor is to create a fluorine plasma from $NF_3$ to chemically react with the $SiO_2$ within the chamber. However, the fluorine plasma corrodes the reactor over time and is very expensive. Therefore, it is desirable to use a minimum amount of $NF_3$ to clean the reactor adequately. Techniques used to determine when a cleaning process is complete include the monitoring of optical emissions from the plasma within the reactor. The monitoring of optical emissions allows the in-situ clean process to be ended as soon as possible after all undesirable $SiO_2$ material has been removed from the inside of the reactor to avoid damage to the reactor, minimize expense, and reduce reactor downtime.

Accordingly, it is desirable to monitor many different plasma processes including deposition, etching, and cleaning by optical endpoint detection through a window. However, plasma reactor gases, byproducts, or other particles tend to become deposited onto the window during processing in the plasma process chamber partially or completely blocking the light passing through the window. Such deposits on the window adversely effect the endpoint detection system. Accordingly, it would be desirable to maintain the window or optical viewport clear of any plasma reactor gases, byproducts, or other particles which adhere to and contaminate the window.

SUMMARY OF THE INVENTION

The present invention provides a viewport for endpoint detection in a process chamber having an purge gas flow which purges the viewport and prevents deposition of contaminants which may obstruct the ability to optically detect a process endpoint.

In accordance with one aspect of the present invention, a method of endpoint detection for monitoring a process in a gas phase process chamber includes the steps of providing an optically transparent window on a wall of a gas phase process chamber, separating the window from the process chamber by a prechamber, feeding a purge gas through the prechamber to prevent deposition of contaminants on the window, and optically detecting an endpoint of the process within the process chamber through the window.

In accordance with a more detailed aspect of the present invention, the purge gas is fed from the prechamber into the process chamber through a hole connecting the prechamber to the process chamber.

In accordance with an additional aspect of the present invention, a gas purged viewport for a gas phase process chamber includes an optically transparent window on a wall of a gas phase process chamber, and a prechamber separating the optically transparent window from the process chamber. An inlet allows purge gas to pass into the prechamber to prevent contamination of the optically transparent window. The purge gas passes out of the prechamber into the process chamber.

In accordance with a further aspect of the present invention, the gas purge system for a gas phase process chamber is used to purge a part such as, a window, a sensor, an O-ring, or another part which may be contaminated, corroded, or attacked by a process gas or byproduct.

BRIEF DESCRIPTION OF THE DRAWINGS

The features and advantages of the present invention are well understood by reading the following detailed description in conjunction with the drawings in which like numerals indicate like elements, and in which:

FIG. 1 is a schematic view of a gas purged optically transparent viewport in accordance with the present invention;

FIG. 2 is a side cross-sectional view of one embodiment of a gas purged optically transparent viewport according to the present invention; and FIG. 3 is an enlarged side cross-sectional view of one embodiment of a prechamber outlet according to the present invention.

DETAILED DESCRIPTION OF THE PREFERRED EMBODIMENTS

The gas purged viewport 10 for endpoint detection according to the present invention is illustrated schematically in FIG. 1. The gas purged viewport 10 is mounted on a side wall of a gas phase processing reactor 12. The processing reactor 12 may be any of the known reactors including TCP and ECR plasma processing reactors used for deposition of thin films and film etching. Examples of other reactors in which the invention may be used include thermal CVD deposition reactors, diode reactors, and magnetically enhanced diode reactors. The optical viewport 10 is provided on the reactor 12 to allow light to pass out of a process chamber 14 of the reactor for endpoint detection. The invention employs a purge gas to keep the optical viewport region free of etch gases, byproducts, particulates, and other contaminants which may be deposited on the viewport 10 reducing optical transparency.

The viewport 10 includes an optically transparent window 16 mounted on a side wall 18 of the processing reactor 10. A prechamber 20 is positioned between the window 16 and the process chamber 14 and a flow of purge gas through the prechamber purges the viewport 10. The prechamber 20 has a purge gas inlet 22 for delivery of purge gas to the prechamber and an outlet hole 24 through which the purge gas passes into the process chamber 14. Light rays γ pass from the process chamber 14, through the prechamber outlet hole 24, through the prechamber 20, and through the window 16 to an optical detector or measuring device (not shown in FIG. 1) positioned outside of the reactor 12. The optical detector or measuring device monitors the light passing through the viewport 10 to determine an endpoint of the reaction taking place within the reactor 12.

A flow rate of the purge gas through the prechamber 20 is large enough so that the viewport region, and particularly the prechamber, is kept free of process gases, byproducts, particulates, and other contaminants. In fact, the continuous flow of purge gas through the outlet hole 24 of the prechamber 20 effectively prevents gases from the process chamber 14 from entering the prechamber. The purge gas may be an inert gas, such as helium, or may be a fraction of the process gas which is passed into the process chamber 14 through the prechamber 20. When an inert gas is used, the flow rate of the inert gas is small enough so that the inert gas does not effect the process within the process chamber 14 and process shift is prevented. The specific flow rate of the inert gas will depend on many factors including the size of the reactor 12, the process being performed in the reactor, the flow rate in the process chamber 14, the size of the outlet hole 24, the inert gas used, and the pressure and temperature of the gases in the reactor.

When a process gas is used as a purge gas, the combination of the process gas provided to the process chamber and the process gas provided through the prechamber must achieve a proper mix of process gases in the process chamber. However, if the process performed in the chamber is changed, the flow rate of the process gas used as a purge gas should be adjusted accordingly. A combination of inert gas and process gas may also be used as a purge gas.

The flow rate of the purge gas will vary between about 0.1 and 200 sccms, preferably between about 0.5 and 50, and more preferably between about 1 and 10 sccms. When an inert purge gas is used, an inert gas flow rate through the prechamber 20 of between about 5 and 15 sccms would be appropriate for a process chamber with a flow rate of about 100 to 200 sccms and a prechamber outlet hole 24 with a diameter of about 1 mm. Such an inert gas flow rate is only an example of an appropriate flow rate which will effectively purge the viewport 10 without causing process drift. Many other purge gas flow rate and outlet hole diameter combinations would also achieve effective purging of the viewport without causing process drift.

The purge gas flow from the prechamber 20 to the process chamber 14 is covered by the criterion for "pinched" flow. To achieve "pinched" flow, the gas pressure upstream (in the prechamber 20) should be a least two times the gas pressure in the process chamber 14. The flow rate is determined by the size of the outlet hole 24 and the pressure difference. According to one preferred embodiment of the present invention, the pressure in the prechamber 20 is between about 3 and 20 times the pressure in the process chamber 14, and the flow rate ranges from about 0.5 to 50 sccms.

Examples of inert gases which may be used as purge gases in the present invention with minimal or no effect on reactions taking place in the processing chamber include He, Ar, Ne, and Kr. The purge gas can also be a process gas such as $Cl_2$, $CF_4$, HBr, $BCl_3$, $SF_6$, $N_2$ and $O_2$ as long as the process gas does not cause corrosion or otherwise interfere with transparency of the window.

Endpoint detection according to the present invention is used to monitor a process such as deposition, etching, or cleaning by one of the known optical endpoint detection methods. In one such method, the plasma or wafer is viewed with a suitable wavelength selective element such as a light filter, a spectrometer, diffraction gratings, or a prism. A photodetector converts light from the wavelength selective element to electrical voltage which is amplified and monitored by a computer to determine a process endpoint. The light which passes through the viewport for endpoint detection may be either light which is emitted by the plasma within the chamber or light which has been directed at the wafer from an external source, such as a laser, through a second window and is reflected by the wafer, for example, in the case of a non-plasma CVD reactor. The second window, through which the laser is directed is preferably also provided with a viewport purge system.

The viewport purge system according to the present invention is preferably operated continuously throughout the use of the process chamber to prevent deposition of contaminants on the viewport window 16. The continuous operation prevents gases from passing from the process chamber 14 through the outlet hole 24 into the prechamber 20 at any time during processing, thus, completely preventing contamination.

One example of an endpoint detection system with a gas purged viewport is illustrated in FIG. 2. The plasma processing chamber side wall 18 of FIG. 2 is an anodized aluminum chamber plate having the prechamber 20 formed therein. The purge gas is delivered to the prechamber 20 through a gas line 30 and a passage 32 in the side wall 18 connected to the purge gas inlet 22. The purge gas passes from the prechamber 20 to the process chamber 14 through the outlet hole 24 having a variable diameter which is described in further detail below with respect to FIG. 3.

The window 16 of FIG. 2 is a quartz window having a diameter of about 0.5 to 10 cm, preferably about 1 inch (2.54 cm). The window 16 is secured to the side wall 18 by a window retaining ring 34 and a plurality of bolts 36 and sealed to the side wall by an O-ring 28. Outside of the window 16, a lens system 38 and a detector system 40 are positioned to convert light to an electrical signal. The detector system 40 may be a verity EP detector box including a detector and an amplifier.

Connected to the gas line 30 is a source of purge gas 42. The source of purge gas 42 may be the same as the source of purge gas which is provided for backside cooling of the wafer and other cooling of the reactor. The purge gas flow is preferably controlled by a pneumatically controlled iso valve 44 or other known valve and a fixed orifice plate 46 having an orifice of about 10 to 20 $\mu$m. Preferably a gas filter 48 is also provided in the gas line 30. The valve 44 is normally closed and is mounted as close as possible to the chamber side wall 18. The valve 44 is opened to purge the viewport during loading and unloading of the process chamber 14, and during processing in the process chamber.

As shown in FIG. 3, the variable diameter outlet hole 24 through which the purge gas passes from the prechamber 20 into the process chamber 14 includes an internally threaded seat 52 and an externally threaded screw-in disk 54. Disks 54 of different sizes are used to achieve different flow rates of the purge gas into the process chamber 14.

Although the window 16 according to the present invention has been illustrated and described as a quartz window, it should be understood that the window may also take other configurations which allow light to pass from the prechamber to the light detector or measuring system. For example, the window may be a light pipe mounted in the wall of the process chamber 14. In addition, the various connecting pipes, the valve, and the filter have been shown by way of example. Alternative configurations may also be used without departing from the present invention.

The invention has been illustrated with the prechamber 20 located within the side wall 18 of the reactor and the window 16 positioned on an outside of the side wall. However, the prechamber 20 may alternatively be positioned outside of the side wall or the window 16 may be positioning within the side wall.

In addition to the use of a purge gas to protect a viewport in a gas phase processing reactor, the gas purge system according to the present invention can also be used to purge other parts which are exposed to process gas in the process chamber and may be contaminated, corroded, or attacked. Examples of reactor parts which may be purged according to the present invention include O-rings, steel parts, and sensors. Any such reactor parts may be purged by a purge gas as described above to prevent corrosion, contamination, or otherwise undesirable contact with gases and/or byproducts of the reactor.

While the invention has been illustrated and described in accordance with the preferred embodiments of the present invention, it is recognized that various changes and alterations may be made therein without departing from the invention as set forth in the claims.

What is claimed is:

1. A gas purged viewport for a gas phase process chamber comprising:

an optically transparent window on a wall of a gas phase process chamber;

a prechamber separating the optically transparent window from the process chamber;

an inlet for passing purge gas into the prechamber to prevent contamination of the optically transparent window; and an outlet for passing purge gas from the prechamber into the process chamber.

2. The gas purged viewport for a gas phase process chamber according to claim 1, wherein the outlet for passing purge gas from the prechamber into the process chamber is a hole positioned to allow optical detection of light passing from the process chamber through the hole, the prechamber, and the window to a measuring device.

3. The gas purged viewport for a gas phase process chamber according to claim 2, wherein the hole includes a removable insert for adjusting a purge gas flow rate.

4. The gas purged viewport for a gas phase process chamber according to claim 1, wherein the inlet and outlet are sized to feed the purge gas at a predetermined flow rate at which process byproducts are prevented from contaminating the window and process drift is prevented.

5. The gas purged viewport for a gas phase process chamber according to claim 1, further comprising an optical measuring device positioned to detect an endpoint by measuring light passing through the outlet, the prechamber, and the window from the process chamber.

6. The gas purged viewport for a gas phase process chamber according to claim 1, wherein the viewport is located on an ECR reactor.

7. The gas purged viewport for a gas phase process chamber according to claim 1, wherein the viewport is located on a low pressure plasma etch reactor.

8. The gas purge viewport for a gas phase process chamber according to claim 1, wherein the purge gas is an inert gas.

9. The gas-purged viewport for a gas phase process chamber according to claim 1, further comprising a flow control to control the flow of the purge gas.

10. The gas purged viewport for a gas phase process chamber according to claim 9, wherein the flow control allows for a flow rate of the purge gas so that the prechamber is kept free of process gasses.

11. A gas phase process chamber having a gas purge part comprising:

a process chamber;

a part which is adversely effected by exposure to process gas and byproducts from the process chamber;

a prechamber separating the part from the process chamber;

an inlet for passing purge gas into the prechamber to prevent adverse effects on the part; and an outlet for passing purge gas from the prechamber into the process chamber.

12. The gas phase process chamber according to claim 11, wherein the part is an optically transparent window.

13. The gas phase process chamber according to claim 11, further comprising a flow control to control the flow of the purge gas.

14. The gas phase process chamber according to claim 13, wherein the flow control allows for a flow rate of the purge gas so that the prechamber is kept free of process gasses.

15. The gas phase process chamber according to claim 11, wherein the part which is adversely effected by exposure to process gas and byproducts from the process chamber is a sensor, an O-ring or a steel part.

* * * * *